United States Patent [19]

Brooks

[11] Patent Number: 5,377,248
[45] Date of Patent: Dec. 27, 1994

[54] SUCCESSIVE-APPROXIMATION REGISTER

[76] Inventor: David R. Brooks, P.O. Box 317, Applecross, Western Australia 6153, Australia

[21] Appl. No.: 62,041

[22] Filed: May 12, 1993

Related U.S. Application Data

[63] Continuation of Ser. No. 700,148, May 16, 1991, abandoned.

[30] Foreign Application Priority Data

Nov. 29, 1988 [AU] Australia .................. PJ1694

[51] Int. Cl.$^5$ .............................................. G11C 19/00
[52] U.S. Cl. ........................................ 377/70; 377/75; 377/76
[58] Field of Search .................. 377/70, 75, 76; 341/347

[56] References Cited

U.S. PATENT DOCUMENTS

| | | | |
|---|---|---|---|
| 3,510,576 | 5/1970 | Centanni | 178/6 |
| 4,156,288 | 5/1979 | Spendorfer | 377/70 |
| 4,336,526 | 6/1982 | Weir | 340/347 |
| 4,396,829 | 8/1983 | Sugihara et al. | 377/54 |
| 4,441,198 | 4/1984 | Shibeta et al. | 377/78 |
| 4,527,148 | 7/1985 | Kuboki et al. | 340/347 |
| 4,612,659 | 9/1986 | Starke | 377/76 |
| 4,649,371 | 3/1987 | Kolluri | 340/347 |
| 4,654,584 | 3/1987 | Gyles | 324/76 |
| 4,688,018 | 8/1987 | Vaughn | 340/347 |
| 4,764,750 | 8/1988 | Kawada | 340/347 |
| 4,829,302 | 5/1989 | Oitzl et al. | 341/165 |
| 4,851,838 | 7/1989 | Shier | 341/121 |
| 4,852,130 | 7/1989 | Drazelmayr | 377/81 |
| 4,975,932 | 12/1990 | Matsushima et al. | 377/75 |
| 4,984,189 | 1/1991 | Neki | 377/70 |
| 5,033,067 | 7/1991 | Cole et al. | 377/70 |

OTHER PUBLICATIONS

"Halbleiter Schaltungstechnik" by Tietze and Schenk 7th Revised Ed. Springer Verla 1985 pp. 767–771.
IEEE Proceedings E Computers & Digital Techniques vol. 128, No. 2 Part E Mar. 1981, pp. 79–83.
Conference Record, 11th Asilomar Conf. Nov. 7–9, 1977 Pacific Grove, Calif., pp. 45–49.
Russel et al. Computer Design, vol. 11, No. 7, Jul. 1972, pp. 81–86, T. O. Anderson.

*Primary Examiner*—Margaret Rose Wambach
*Attorney, Agent, or Firm*—Learman & McCulloch

[57] ABSTRACT

A successive-approximation register (SAR) has a single shift register for processing, that is presetting and selectively resetting, a number of bits. The single shift register is arranged to provide bit selection for processing the bits and also to provide desired result accumulation in the processed bits. Further, the single shift register comprises an array of stages, the stages including a first stage, a last stage and a number of active stages equal to the number of bits of digital output. Conveniently, the SAR adopts a "One-bits to Right" test implemented by a Manchester Carry Chain in the opposite direction to the shift direction.

37 Claims, 5 Drawing Sheets

FIG - 1   ANALOGUE-TO-DIGITAL CONVERTER (PRIOR ART) USING A SUCCESSIVE-APPROXIMATION REGISTER

FIG - 2   DIGITAL-TO-ANALOGUE CONVERTER (R/2R LADDER) (PRIOR ART)

FIG - 3   S.A.R. (PRESENT INVENTION)

FIG - 4A   "ONE-BITS TO RIGHT" TEST SWITCH LOGIC

FIG - 4B   "MANCHESTER CARRY CHAIN" SWITCH LOGIC

FIG - 4C    FIRST STAGE

FIG - 4D    ACTIVE STAGE

FIG - 4E    LAST STAGE

CIRCUIT SCHEMATICS (PRESENT INVENTION)

FIG - 5  STATIC & DYNAMIC STORAGE CELLS (PRIOR ART)

FIG - 6  ACTIVE STAGE - RAPID INITIALIZATION

FIG - 7  ACTIVE STAGE - SERIAL OUTPUT

FIG - 8

SUCCESSIVE-APPROXIMATION REGISTER

This is a continuation of copending application(s) Ser. No. 07/700,148 filed on May 16, 1991, now abandoned, International Application PCT/AU89/00518 filed on Nov. 29, 1989 and which designated the U.S.

FIELD OF INVENTION

The present invention relates generally to the field of Digital-to-Analogue (DAC) and Analogue-to-Digital (ADC) Converters. More particularly, the invention relates to a Successive-Approximation Register (SAR) for use in such converters.

Most specifically, the invention relates to a method of implementing such SAR, utilising a single register only, to provide both the addressing and data-storage functions (as more fully hereinafter described), requiring significantly less electronic circuitry than known prior art designs.

BACKGROUND OF THE INVENTION

In electronic instrumentation systems, it is frequently necessary to accept an analogue value (i.e. a continuously varying electrical signal) and to transform the value of that signal into a digital representation for subsequent processing.

Such a digital representation is commonly made as a binary fraction of some known "reference" value, that is the "quantity" is represented as a N-bit binary number, whose value X denotes the Quantity thus Quantity = Reference $x(X/2^N)$,
where the value X may range from zero to $2^N - 1$.

This notation may represent real quantities from zero to just less than the chosen Reference value. For example, if the Reference value is chosen as 10.24V (i.e. $2^{10} \times 0.01V$), and the digital representation is in 10 bits, we may represent voltages from zero to 10.23V, to within an accuracy of 0.01V.

Many techniques for executing Analogue-to-Digital conversion have been described in such standard texts as "Bipolar and MOS Analog Integrated Circuit Design" (Grebene A., John Wiley, 1984). The present invention is of specific application to converters employing the so-called "Successive Approximation" method, which is known.

A technique of logic design practiced in Very Large-Scale Integration (VLSI) circuits, is the so-called "dynamic" technique (see, inter alia, Mead and Conway, "Introduction to VLSI Systems", Addision-Wesley, 1980). This scheme relies upon the short-term storage of information as electrical charges in stray wiring capacitance. Adroitly used, this method can result in considerable reductions in circuit complexity and power consumption. Its disadvantage is that the electrical charges will slowly "leak" (due to imperfect insulation), resulting in loss of the stored information. It is therefore a characteristic of Dynamic circuits to refresh, that is any information so stored must be periodically read out and re-written to maintain the charge.

Figure 1:
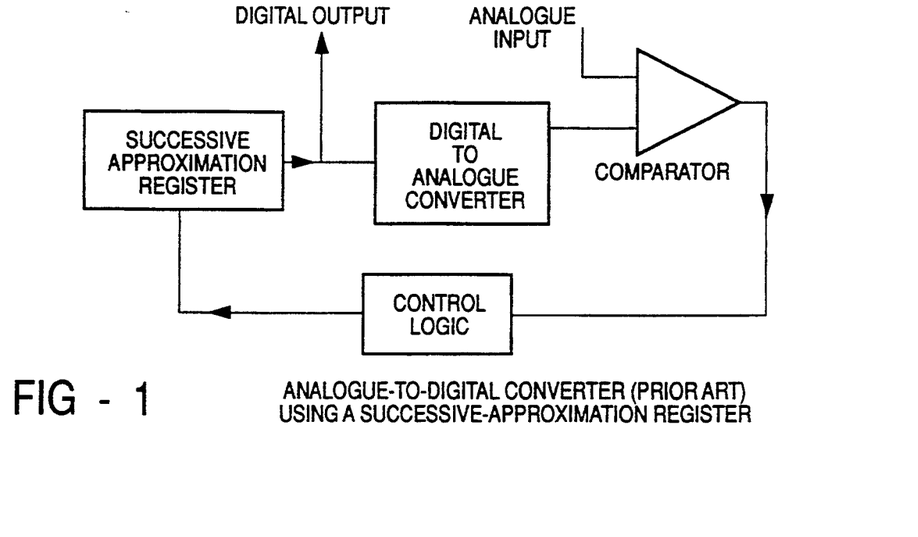
FIG. 1 shows a prior art ADC using an SAR.

According to a known Successive Approximation method of conversion, there is provided at least a Successive-Approximation Register (SAR), a Digital-to-Analogue Converter (DAC), a Comparator, and some form of sequencing or control logic, or as is shown in FIG. 1.

Figure 2:
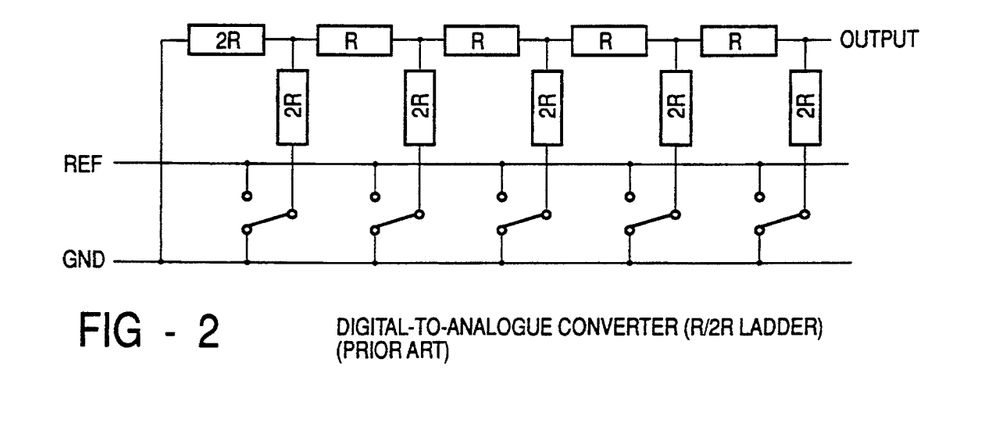
FIG. 2 shows a prior art R/2R ladder DAC.

The DAC is adapted to develop an analogue output, equal to the Reference voltage multiplied by the binary fraction stored in the SAR, as described above. Many methods of achieving this are known, for example the so-called "R/2R Ladder" method as illustrated in FIG. 2. As may be seen, the circuit comprises an array of switches adapted to switch between Ground and the Reference voltage, and an array of resistances, being alternately of some value (R) and twice that value (2R). By suitably setting the several switches, voltages between zero (Ground) and Reference may be developed at the output. In a practical ADC, the several switches are adapted to be controlled by the several bits of the SAR.

This output voltage is applied to the Comparator, which develops a logical (i.e. True/False) output indicating whether the DAC output is higher or lower than the unknown analogue input. This logical output is used by the Control Logic to adjust the binary number held in the SAR, so as to bring the DAC output as close as possible to the unknown analogue input.

The operating principle is typically as follows:

The Control Logic begins by setting all the SAR bits to Zero. The most significant SAR bit is then preset to One, and the Comparator output is tested. If the DAC output is found to be higher than the unknown input, the SAR bit is cleared or reset back to Zero, otherwise it remains set to One. The Control Logic then presets the next lower significance SAR bit, and proceeds similarly, until all SAR bits have been processed.

Conveniently, a given SAR bit is preset to One, simultaneously with the selective resetting of its predecessor.

When this process is complete, the required digital representation of the unknown input is held in the SAR bits. The requirement to maintain the SAR output for extended periods of time usually precludes the use of Dynamic logic (as aforedescribed) in practical SAR designs.

This technique is widely used in practical devices.

It will be apparent that at least two Data Storage Means are required namely, the SAR bits themselves, and some further means (assumed in the above example to be contained within the control logic) to keep track of which SAR bit is currently being processed.

Practical systems have utilised either a counter or a shift register circuit to perform this latter (bit addressing) function. An example of the shift-register technique may be found in the 74LS502 SAR integrated circuit (Fairchild Semiconductor, Inc.) whose operation is described in the manufacturer's data sheets.

It will be appreciated that when two shift registers are used, the second (addressing) register consumes a similar amount of electronic circuitry (area) to the actual SAR register itself. Counter-based systems consume a similar amount of extra circuitry for the requisite Counter and Decoder. Heretofore, it has not proved possible to eliminate this extra circuitry. Clearly such elimination would be desirable, leading to greater economy in manufacture than has heretofore been possible.

There are numerous prior art pertaining to SAR design and to Analogue-to-Digital conversion and particularly orientating toward improving the speed of operation of the SAR rather than seeking to reduce the circuit complexity. Some known prior art are U.S. Pat. No. 4,527,148, U.S. Pat. No. 4,764,750, EP258840, EP 258841.

Others, for example U.S. Pat. No. 4,654,584, relate to various forms of Analogue-to-Digital Converters rather than to the internal functioning of SAR.

In U.S. Pat. No. 4,688,018, the problem of SAR design is addressed. However, it discloses and requires separate Shift Register (SHR1, SHR2, SHR3, SHR4) and SAR storage cells (12, 14) rather than a single storage cell to perform both functions of bit addressing and accumulating the result. Further, the use of separate Shift Register and SAR latches necessitates additional serial signal paths (8 in U.S. Pat. No. 4,688,018) between successive stages.

Furthermore, the operation of the SAR latch (36) requires that the string of set/reset transistors (52, 54, 56) have a greater electrical conductivity than the latch transistors (inverter 38). This arrangement of differentially conductive transistors may preclude fabrication of circuits according to a form of semiconductor chip design on so called "Gate Array" devices, characterized by a multitude of transistors all of a standard size, thus able to offer low design and set-up costs. To modify such circuit arrangement to eliminate the requirement for differentially conductive transistors, significantly more transistors may be required for the modified design.

U.S. Pat. No. 4,441,198 is intended to increase the operating speed of SAR using both edges of the clock signal. Two latch elements per bit of the SAR are disclosed.

OBJECTIVES OF THE INVENTION

It is an object of the present invention to alleviate some or all of the disadvantages of the prior art and to simplify the design of SAR.

It is a further object of the present invention to provide a method of implementing a SAR and its addressing function, within a single shift register, thereby utilising approximately half the circuitry needed by prior art devices.

It is a further object of the present invention to provide a means whereby such a register functioned as described above may conveniently be fabricated, especially on Very Large-Scale Integration (VLSI) chips.

It is a further object of the present invention to provide a Register as described above further incorporating self-refresh features, thereby permitting its implementation using so-called dynamic logic (as hereinbefore described), and permitting further reductions in chip-area and operating power requirements.

It is a further object of the present invention to provide a Register as described above being capable of fabrication using transistors all of a single standard size, so facilitating the realisation thereof on Gate Array devices.

SUMMARY OF THE INVENTION

In the following description, it will be assumed that the SAR shifts from left to right. This will imply that the leftmost bit is the most significant, and the rightmost the least significant. Naturally, the converse arrangement is equally feasible, as would be understood by the skilled addressee and thus also falls within the scope of the present invention.

Likewise, the logic structures herein described are capable of many forms of practical embodiment in electronic circuitry, as would be understood by those skilled in the art. Such alternative embodiments, such as various forms of MOS, bi-polar, discrete or others also fall within the scope of the present invention. Accordingly, the preferred embodiment described hereinafter, which assumes a Complementary Metal Oxide Semiconductor (CMOS) fabrication process, is to be regarded as exemplary only.

The present invention provides a successive-approximation register (SAR) having a single shift register for processing, that is presetting and selectively resetting, a number of bits, wherein said single shift register is arranged to provide bit selection for processing the bits and also to provide desired result accumulation in the processed bits.

The present invention may provide an SAR wherein processing of a given bit is arranged to start simultaneously, on the same clock signal, with the completion of processing its immediate preceding bit and the presetting of the given bit is arranged to occur simultaneously, on the same clock signal, with the selective resetting of its immediate preceding bit.

Conveniently, a processed bit is recognized by having at least one set bit in the shift direction, the bit being processed is recognized by having no set bit in the shift direction and is itself a set bit, an unprocessed bit is recognised by having no set bit in the shift direction and is itself not a set bit, and the next bit to be processed is recognised by having no set bit in the shift direction and having an adjacent set bit in the opposite direction to the shift direction and is itself not a set bit.

In practice, the status recognition of bits is performed by a Manchester Carry chain, said chain being arranged to pass information in the opposite direction to the shift direction.

The present invention may also provide an SAR wherein the shift register comprises an array of stages and the stages include a first stage, a last stage and a number of active stages equal to the number of bits of digital output.

Preferably, the first stage is adapted to provide an output for presetting the active stages, and the last stage is adapted to provide an output for controlling the bit selection for processing the active stages.

Further, each active stage may comprise a storage cell for storing successive bits of the desired digital output and switches for selective processing of data for said storage cell, and each switch may be implemented in CMOS.

The SAR in accordance with the present invention may be implemented in VLSI, MOS or Gate Array devices.

BRIEF DESCRIPTION OF THE DRAWINGS

Preferred embodiments of the present invention will now be described with reference to the accompanying drawings, wherein.

DETAILED DESCRIPTION OF THE INVENTION

An SAR according to the invention comprises a shift register, said register comprising a plurality of stages, each stage comprising a storage cell and additional logic functions, as hereinafter described. Conveniently, there will be provided as many stages as are the number of required bits (N) in the resulting digital value (N=10, in the example cited above). These stages are connected in a series chain, so that information may be caused to move from left to right along the chain. There are additionally provided according to the invention, dummy first and last stages, which define the ends of the chain, said first and last stages themselves not contributing to the digital output value.

Figure 3:
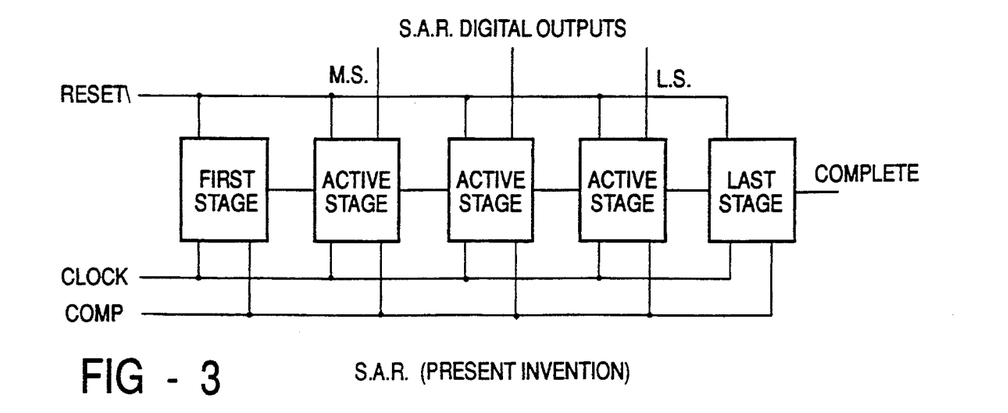
FIG. 3 shows an SAR according to the present invention.

The general arrangement of the present invention is illustrated in FIG. 3. The CLOCK signal causes each stage to assume a new data value. The COMP input is the output of the comparator (of FIG. 1), and indicates whether the current SAR value is above or below that required. The RESET\ input is used to initially set all SAR bits to Zero (the "\" suffix denoting that the signal is Active-Low).

As described above, operation begins by setting all storage cells to Zero, by simultaneous application of RESET\ and CLOCK signals.

Once the RESET\ signal is deactivated, the next CLOCK will cause the first stage to emit a logical One signal (for this one CLOCK event only). This One will shift into the first active stage, so presetting the most significant bit to One, as described above. The comparator presents its result on the COMP line, and the CLOCK is re-applied. This causes the next stage to the right to be preset to One, simultaneously the current active stage will be reset to Zero if the comparator indicates that the SAR value is too high.

Subsequent CLOCKS will repeat this process on each SAR bit in turn, until the shifted One bit reaches the last stage. This last stage is so designed that once set to One, it remains set (until the next RESET\), and so provides a Conversion Complete output signal.

The invention is embodied in the design of the logic within each said stage, said logic being adapted to recognize when its stage is due to preset to One or to selectively reset to Zero by COMP, and when its stage is not permitted to change. This permits a single array of stages both to provide its own addressing, and to accumulate the required output data.

The invention stems from the observation that, once any given stage has been evaluated (i.e. preset and selectively reset), there will always be at least one stage to its right holding a One-bit. Such a given stage may not change its value again until the next RESET\. Thus, a procedure may be followed to preset the next stage to One-bit simultaneously with the selective resetting the One-bit of the given stage. Likewise any other stage having no One-bits to its right, and its immediate left neighbour also holding Zero, is not yet to be set, and hence also should not change.

At the rightmost One-bit stage in the chain, the following rule holds:

the next stage to the right shall become preset to One, while the present stage itself shall selectively reset to Zero, that is, if the comparator shows the SAR value as high.

These rules may be summarised in the following decision table (as is customary, "X" denotes don't care):

| One-bits to Right | Neighbour at left | Present state of this Stage | Comparator: SAR is | Next state of this Stage | Significance |
| --- | --- | --- | --- | --- | --- |
| Y | X | 0 | X | 0 | Bit already set |
| Y | X | 1 | X | 1 | Bit already set |
| N | 0 | 0 | X | 0 | Not yet to be set |
| N | 1 | 0 | X | 1 | Preset bit |
| N | X | 1 | Low | 1 | Hold One-bit |
| N | X | 1 | High | 0 | Reset to Zero |

The "One-bits to Right" test may conveniently be implemented using the so-called "Manchester Carry Chain", which is commonly used to determine when all preceding bits in a counter are set to One (see, inter alia, Mead & Conway, "Introduction to VLSI Systems", Addison-Wesley, 1980). The device comprises a two-way switch, or multiplexer, associated with each stage, being adapted to pass a signal from the preceding stage when the current stage holds a Zero, and to connect instead to a constant (Zero or One) when the current stage holds a One.

In the present case, we require to detect a One among the following bits, and the carry chain is therefore connected in the reverse direction to the usual, passing the carry against the direction of register shift. The start of the carry chain is provided by the last stage, which is provided with special logic for this purpose.

The corresponding decision table for the last stage is as follows:

| RESET\ | Shift + Enable/ | Neighbour to left | Present State of Last Stage | Next state of Last Stage | Manchester carry start |
| --- | --- | --- | --- | --- | --- |
| 1 | X | X | X | 0 | 0 |
| 0 | 1 | X | 0 | 0 | 1 |
| 0 | 1 | X | 1 | 1 | 1 |
| 0 | 0 | 0 | 0 | 0 | 0 |
| 0 | 0 | 0 | 1 | 1 | 1 |
| 0 | 0 | 1 | 0 | 1 | 0 |
| 0 | 0 | 1 | 1 | 1 | 1 |

The Shift+Enable\ signal is optional, and provides a means to inhibit all change in the SAR, should this be required.

Figure 4A:
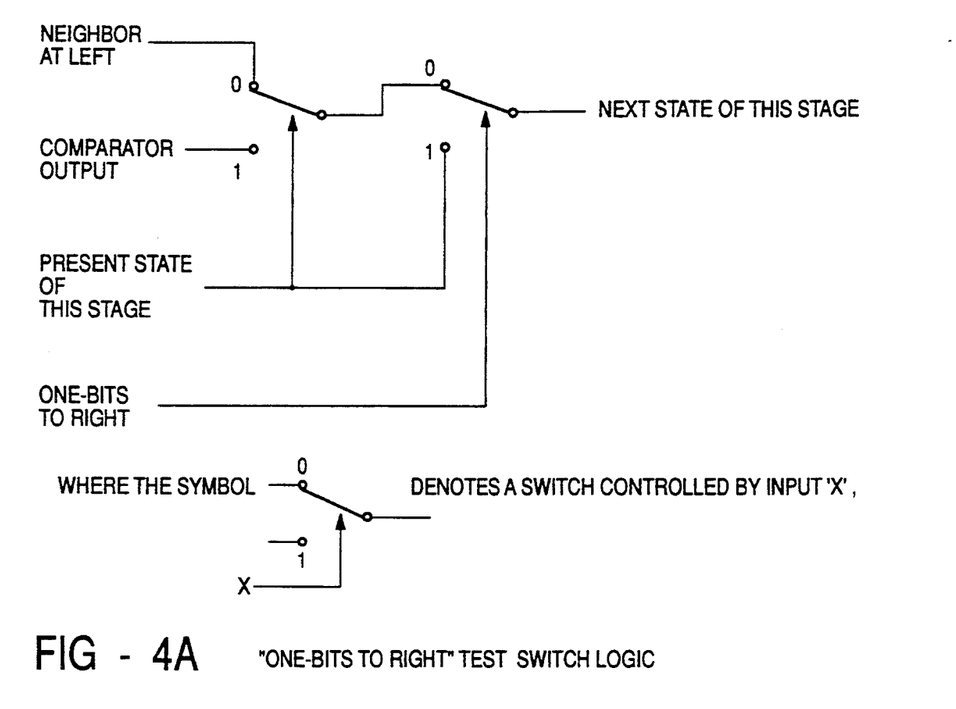
FIGS. 4A and 4B show switch logic designs implementing the present invention.
Figure 4B:
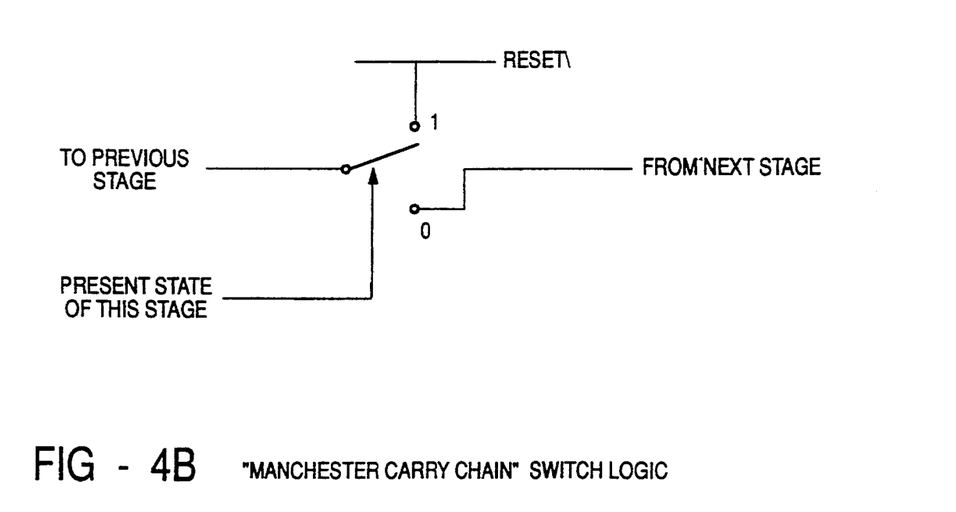

Referring to FIGS. 4A and 4B, switch logic designs implementing the "One-bits to Right" test and the "Manchester Carry Chain" for the Active stage are shown. Each switch is to be set to the "0" position if its controlling input has the value 0 (low) or N and to the "1" position if its input has the value 1 (high) or Y.

The "One-bits to Right" test is controlled by a "ONE-BITS TO RIGHT" switch and a "PRESENT STATE OF THIS STAGE" switch. It will be seen that when the ONE-BITS TO RIGHT has the value 1 (Y), NEXT STATE OF THIS STAGE takes the value of its PRESENT STATE. When the ONE-BITS TO RIGHT has the opposite value 0 (N), NEXT STATE OF THIS STAGE takes either the value of the NEIGHBOUR AT LEFT or the COMPARATOR output depending on the value of its PRESENT STATE.

The "Manchester Carry Chain" is controlled by a "PRESENT STATE OF THIS STAGE" switch. It will be seen that when the PRESENT STATE OF THIS STAGE has the value 0, the signal from NEXT STAGE will be carried TO PREVIOUS STAGE. Otherwise, the signal is not carried and the RESET-\signal (a constant) will be carried TO PREVIOUS STAGE.

One embodiment of the present invention will be described with reference to a CMOS VLSI fabrication process. Exemplary circuit forms are shown in FIGS. 4C, 4D and 4E.

Figure 4C:
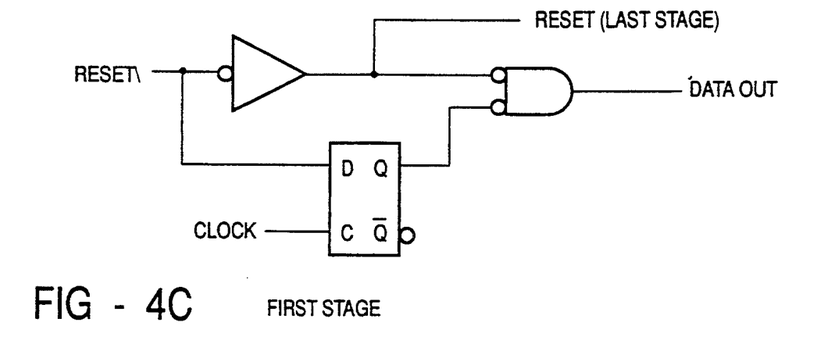
FIGS. 4C, 4D and 4E show schematically the different stages of FIG. 3 in CMOS.
Figure 4D:
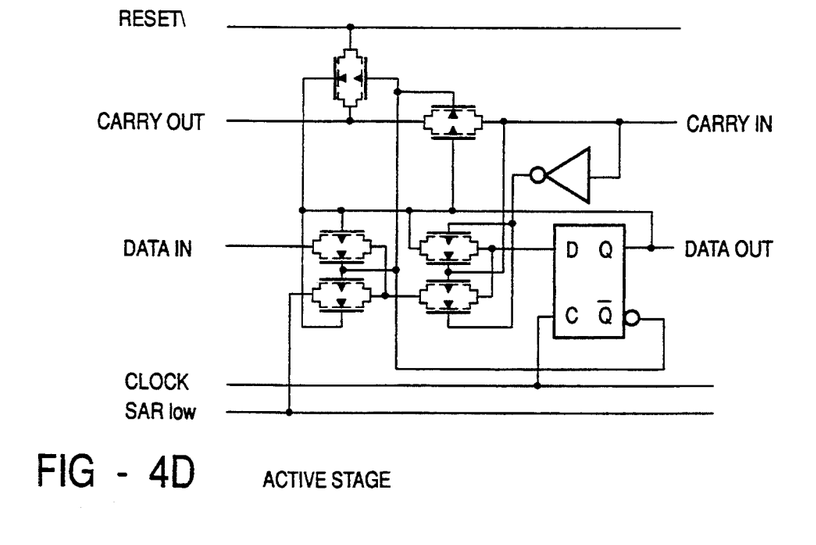
Figure 4E:
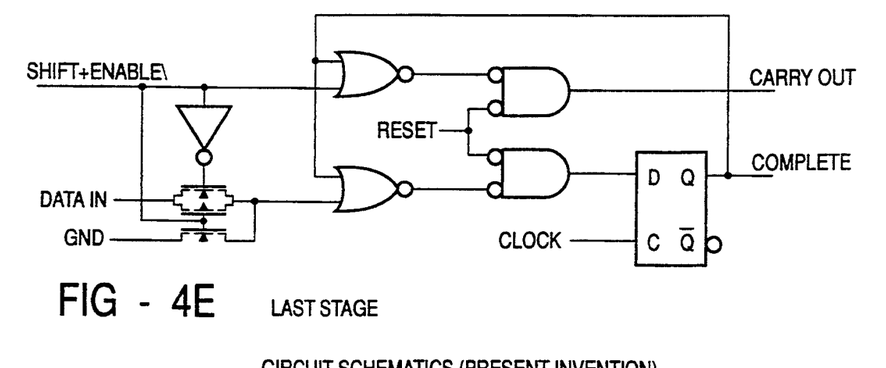

FIGS. 4C is a schematic circuit of the first stage of the present invention shown in FIG. 3. It comprises a logic inverter, NAND gate and flip-flop driven by CLOCK signals. The RESET\signal is provided as input to the flip-flop whilst its inverted signal and the flip-flop output are coupled to the NAND gate to provide the output of the first stage (Data Out).

| RESET | D | Q | DATA OUT | Reset |
|---|---|---|---|---|
| 0 | 0 | X | 0 | 1 |
| 1 | 1 | 0 | 1 | 0 |
| 1 | 1 | 1 | 0 | 0 |
| 1 | 1 | 1 | 0 | 0 |

Its effect is to set DATA OUT high for exactly one cycle of CLOCK after RESET\ itself goes high (after having been low).

FIG. 4D is a schematic circuit of the active stage of the present invention shown in FIG. 3. It embodies the switch logic designs for the "One-bits to Right" test and the "Manchester Carry Chain" of FIGS. 4A and 4B. This is realized by the use of six transistor pass-gates acting as analogue switches in the form of parallel pairs of complementary transistors.

It will be seen that the following are equivalents between the switch logic designs and active stage circuit.

|  | Active Stage |
|---|---|
| Manchester Carry Chain |  |
| RESET\ | = RESET |
| FROM NEXT STAGE | = Carryin |
| TO PREVIOUS STAGE | = Carryout |
| PRESENT STATE OF THIS STAGE | = Data Out or Q |
| One-bits to Right Test |  |
| ONE-BITS TO RIGHT | = Carryin |
| PRESENT STATE OF THIS STAGE | = Data Out or Q |
| NEXT STATE OF THIS STAGE | = D |
| NEIGHBOUR AT LEFT | = Data In |
| COMPARATOR output | = SARlow |

The Data and Carry shift in oposite directions.

The value of the NEXT STATE OF THIS STAGE (D) is primarily controlled by the ONE-BITS TO RIGHT (Carryin) signal and secondarily by the PRESENT STATE OF THIS STAGE (Data Out) signal. The steering logic feeds back the original stored value Data Out (Q) to the storage cell (flip-flop), whenever no change is required (Carryin=1). This advantageously permits (given a high enough clock frequency) the use of Dynamic circuit techniques in the storage cell.

Figure 5:
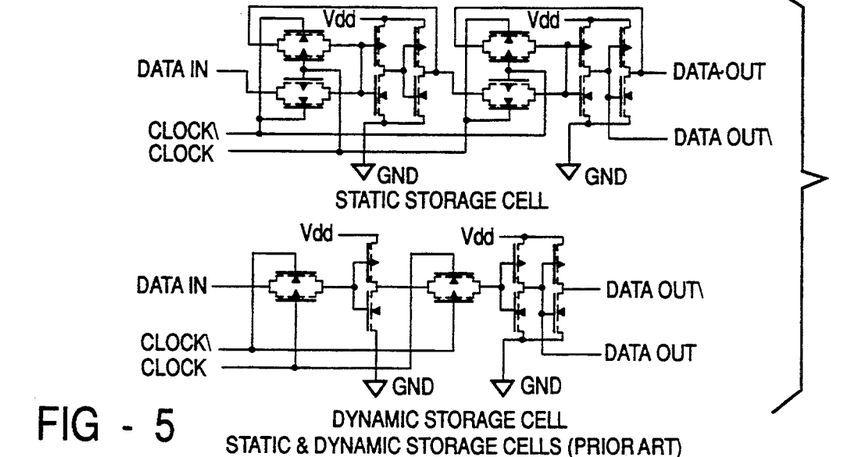
FIG. 5 shows prior art static and dynamic storage cells.

Reference to FIG. 5 (which shows typical storage cells using Static and Dynamic methods) will show that the Dynamic cell requires about half the electronic circuitry (transistors) of its Static counterpart. This saving permits the extra logic of the present invention to be realised with little extra circuitry than would be required for a single register of Static design. Since the present invention requires but one such register to implement an SAR, while prior art requires two, there is a net saving of some 50% of the required circuitry.

Referring back to FIG. 4D, when change is permitted, either the stored value from the previous stage (Data In) or the SARlow signal from the COMPARATOR is input to the storage cell (D).

When RESET\ is off (high), the Carry chain will be connected to a constant high when Data Out is also high, and the chain will also carry the constant high signal from the next stage to the previous stage when Data Out is low.

Operation of the active stage will be as follows:

| RESET\ | Carryin | Data In | Data Out | SARlow | D | Carryout |
|---|---|---|---|---|---|---|
| 0 | 0 | 0 | 0 | 1 | 0 | 0 |
| 0 | 0 | 0 | 1 | 0 | 0 | 0 |
| 1 | 1 | X | 0 | X | 0 | 1 |
| 1 | 1 | X | 1 | X | 1 | 1 |
| 1 | 0 | 0 | 0 | X | 0 | 0 |
| 1 | 0 | 1 | 0 | X | 1 | 0 |
| 1 | 0 | X | 1 | 1 | 1 | 1 |
| 1 | 0 | X | 1 | 0 | 0 | 1 |

It is noted that when RESET\ is low, Carryin (from the last stage) and Data In (from the first stage) will also be low. Further, the value of SARlow may be dependent on the present state of storage cell (Data Out to the Comparator for determining the value of SARlow).

In realising an SAR of more than a few Active Stages, it will be advantageous to periodically regenerate the carry-chain signal by use of a pair of inverters, to improve its speed. This device is described in Mead & Conway, op. cit., and elsewhere, in connection with counters.

FIG. 4E is a schematic circuit of the last stage of the present invention shown in FIG. 3. It implements the "Manchester Carry Chain" for the last stage in accordance with the decision table therefor above. It will be seen that Complete (Q) represents the Present State and Carryout represents the Manchester carry start.

Both the Carryout and the Next State (D) are outputs from respective NOR gates enabled by Reset. The other inputs to the NOR gates are outputs from two separate NOR gates. The NOR gate for the Carryout is enabled by Shift+Enable\ for acquiring the value of the Present State (Q), whilst the NOR gate for the Next State (D) is enabled by the Present State (Q) for acquiring the value of the second last stage (Datain) when Shift+Enable is on low.

Operation of the last stage will be the same as the decision table therefor above.

The above described circuit for an SAR may be realised throughout employing only transistors of a single standard size (typically the minimum permitted by the chosen fabrication process). This makes the embodiment inherently compatible with Gate Array processes and devices.

Appendix 1 gives a simulation run of a 5-bit SAR according to the invention, on the industry-standard circuit simulation program PSpice (from Microsim Corporation, Irvine, Calif.).

Other embodiments of the present invention incorporate amendments or modifications which will be found advantageous in certain applications.

Figure 6:
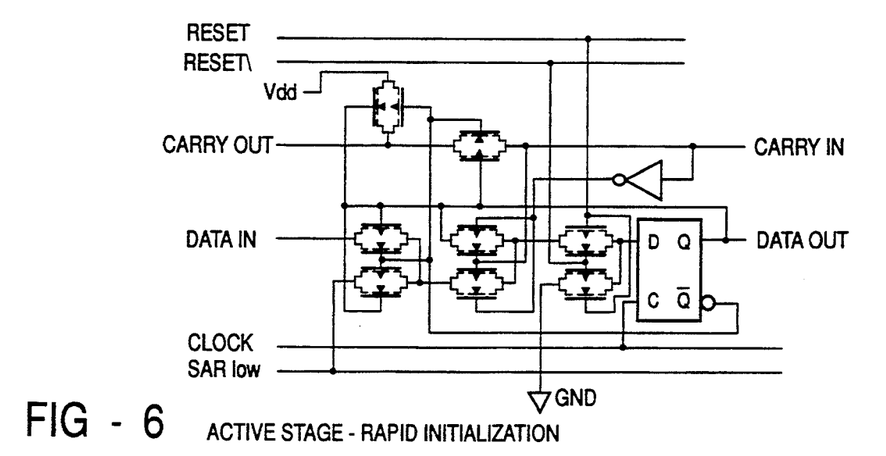
FIG. 6 shows an active stage adapted for rapid initialisation.

FIG. 6 shows the active stage circuit of FIG. 4D, modified including further CMOS transistor switches to permit all SAR stages to be set to Zero by a single Clock signal (upon the application of RESET\). This may be advantageous where maximum operating speed is required.

Figure 7:
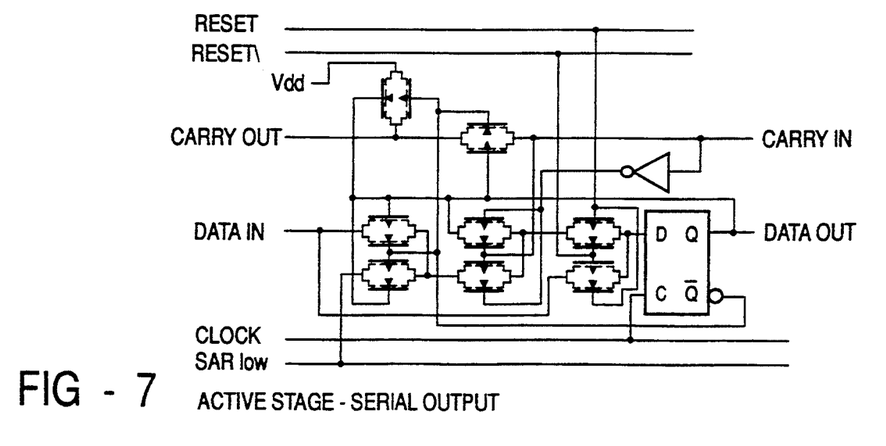
FIG. 7 shows an active stage adapted for serial output.

FIG. 7 shows the active stage circuit of FIG. 4D, further amended to permit the result (at completion of a conversion operation) to be shifted serially out of the SAR, while simultaneously shifting in Zeros, in readiness for the next conversion. In this design, the action of RESET\ forces the SAR to act as a simple shift register. If desired, the SAR contents may be shifted out (for example, for transmission over some suitable medium), and simultaneously shifted back into the SAR. In this case, the effect is to restore the original SAR data, should this be required.

Whilst the primary field of use the present invention is in ADC, SAR may also find other applications. For example, in a phase-locked loop in which such an SAR is employed to provide a self calibrating property, so providing tolerance to manufacturing process variations, as disclosed in copending application PCT/AU88/00445. Other uses will occur to those skilled in the art where SAR of the type hereinbefore described may be found suitable for other functions and purposes, besides those already described.

APPENDIX 1. PSPICE SIMULATION

Figure 8:
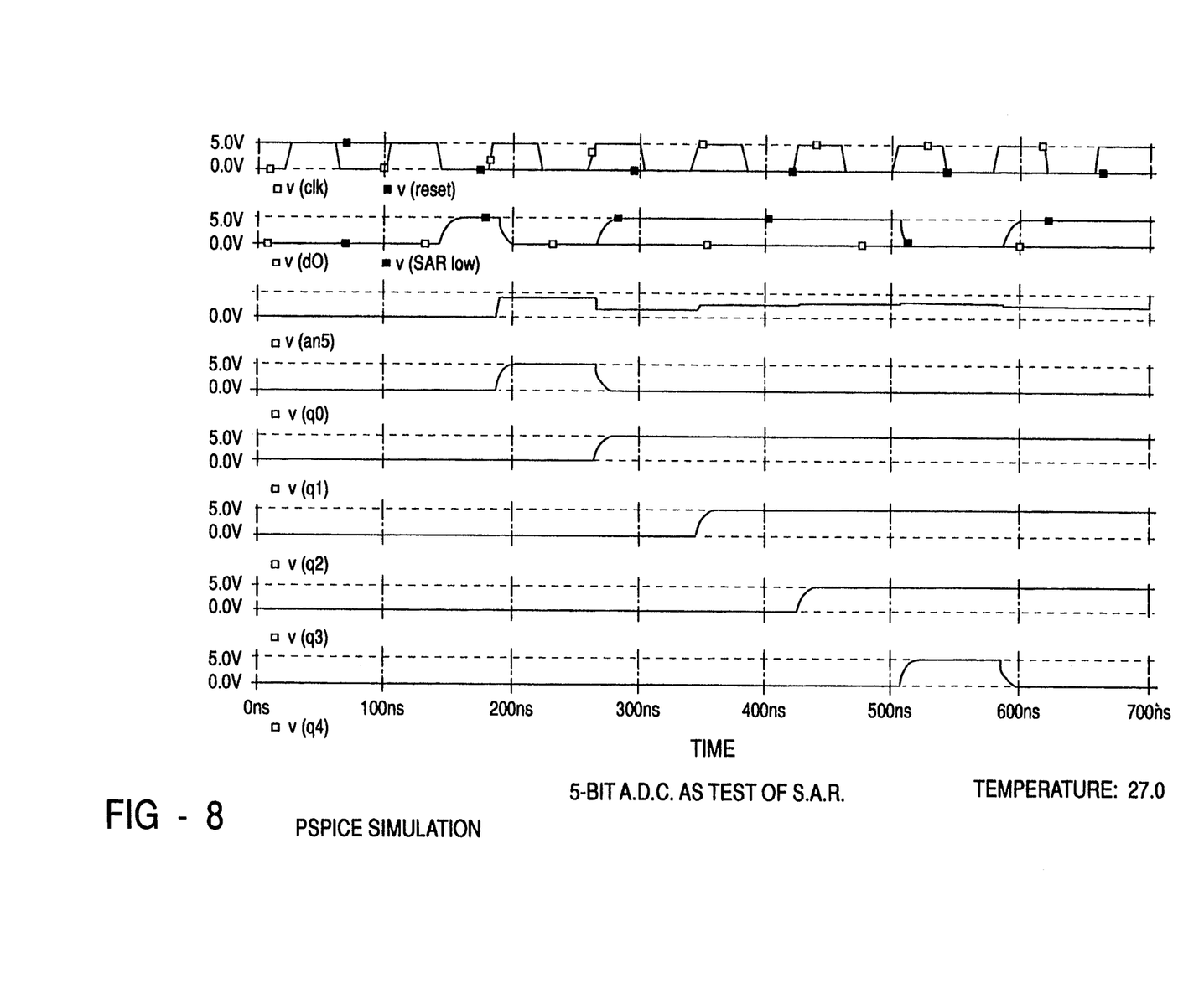
FIG. 8 shows the results of a PSpice simulation of 5-bit ADC having the SAR of the present invention.

The following two files give respectively, a library of simulated logic functions, and a 5-bit SAR according to the Invention, which utilises those simulated functions. The simulation results are given in Figure 8.

* "Pseudo-NMOS" logic Functions          D R Brooks          Nov. 1988
*
* These functions provide quick simulations of NMOS-style logic
* functions.
* Being based on Voltage-Controlled Switches, rather than MOS
* transistors, they require a fraction of the computing resources
* otherwise required, at the expense of a less accurate simulation.
* They are intended to provide support functions for circuits under
* development, where the actual logic implementation is simulated
* separately. A typical use is in mixed analogue/digital simulations
* where most of the computing power is required for the Analogue areas.
*
* General logic specs.:
* Levels:      0V false, 5V true.
* Zout:        1k/5pF
* Zin:         infinite (voltage-controlled resistor)
* Thresholds:  1V, 4V
* Gate Delay:  7nS typical
*
***********************************************************************
*
* The basic Voltage-Controlled Switches (ie "NMOS transistors")

```
.model  trans  vswitch  (ron=1   roff=1e9  voff=1.0  von=4.0)  ;Pulldown
.model  pass   vswitch  (ron=1e4 roff=1e9  voff=1.0  von=4.0)  ;Pass-gate
*
***********************************************************************
*
*  Standard output-load stage (pullup & limit switching rate)
.subckt  load    Vdd    in    out
 rpullup  Vdd    in    100                  ;Pullup resistor
 rslow    in     out   1K                   ;Output Impedance
 cslow    out    0     5pF                  ;Output Delay
.ends
*
***********************************************************************
*
*  Basic Inverter
.subckt invert   Vdd   in    out
sin  inter   0    in    0     trans    ;Pulldown
x1   Vdd     inter  out         load   ;Pullup/Output
.ends
*
***********************************************************************
*
*  2-Input NAND Gate - series string of switches
.subckt nand2    Vdd   in1   in2   out
sin1    inter    inx   in1   0     trans    ;Pulldown
sin2    inx      0     in2   0     trans
x1   Vdd     inter   out         load   ;Pullup/Output
.ends
*
***********************************************************************
*
*  3-Input NAND Gate - series string of switches
.subckt nand3    Vdd   in1   in2   in3   out
sin1    inter    inx   in1   0     trans    ;Pulldown
sin2    inx      iny   in2   0     trans
sin3    iny      0     in3   0     trans
x1   Vdd     inter   out         load   ;Pullup/Output
.ends
*
***********************************************************************
```

```
*
*    2-Input NOR Gate - shunt switches
.  subckt nor2        Vdd      in1       in2       out
sin1         inter     0        in1       0         trans      ;Pulldown
sin2         inter     0        in2       0         trans
x1  Vdd      inter     out                load      ;Pullup/Output
.  ends
*

****************************************************************
*
*    3-Input NOR Gate - shunt switches
.  subckt nor3        Vdd      in1       in2       in3       out
sin1         inter     0        in1       0         trans      ;Pulldown
sin2         inter     0        in2       0         trans      ;Pulldown
sin3         inter     0        in3       0         trans
x1  Vdd      inter     out                load      ;Pullup/Output
.  ends
*

****************************************************************
*
*    Pass-Gate - Active-HIGH Enable
.  subckt hipass      Vdd      control   in        out       ;Vdd is a dummy, for
rdummy       Vdd       0        1e9                          ;consistency with others
s1  in       out       control   0        pass
csave        out       0        50fF      IC=5               ;For use as dynamic node
.ends
*

****************************************************************
*
*    Pass-Gate - Active-LOW Enable
.  subckt lopass      Vdd      control   in        out       ;Vdd is a dummy, for
rdummy       Vdd       0        1e9                          ;consistency with others
s1  in       out       Vdd       control  pass
csave        out       0        50fF      IC=0               ;For use as dynamic node
.ends
*

****************************************************************
*
*    2-Input XNOR Gate - shunt switches
.  subckt xnor        Vdd      in1       in2       out
```

```
sin1          inter     0        in1       in2     trans      ;Pulldown
sin2          inter     0        in2       in1     trans
x1 Vdd        inter     out                load               ;Pullup/Output
.ends
*
****************************************************************
*
* Dynamic, Clocked Buffer (simulates a rising-edge triggered D-flop)
.subckt       clkbuff   Vdd      clock     in      out
x1 Vdd        clock     in       int1      lopass             ;First gate (CLK-)
x2 Vdd        int1      int2              invert
x3 Vdd        clock     int2     int3      hipass             ;Second gate (CLK+)
x4 Vdd        int3      out                invert
.ends
*
****************************************************************
*
* Dynamic, Synchronous Counter Stage (sim. to 74161)
.subckt       ctrbit    Vdd      CLK       LDbar   D     CE   CEout  Q
x1 Vdd        CE        Qbar     cexq      xnor          ;Count: Q xor CE
x2 Vdd        LDbar     cexq     din       hipass        ;Load/Count aux.
x3 Vdd        LDbar     D        din       lopass
x4 Vdd        CLK       din      Q         clkbuff;      The clocked stage
x5 Vdd        Q         Qbar               invert
*
x6 Vdd        Q         CE       CEout     hipass;       The carry chain
scelow        CEout     0        Qbar      0      trans; (Manchester)
.ends
*
****************************************************************
*
* 2-to-1 Multiplexer (N.B. Uses pass-gates: it is NOT unilateral)
.subckt       aux2to1   Vdd      SEL       IN0     IN1   OUT
x1 Vdd        SEL       IN0      OUT       lopass
x2 Vdd        SEL       IN1      OUT       hipass
.ends
****************************************************************
****************************************************************
****************************************************************
5-Bit A.D.C. as Test of S.A.R.
```

```
*   SAR function, implemented as shift register
*   Functional demonstration, using idealised components
*
*   Standard shell for tests (power, clock, & library)
.   lib logic.lib
* vsupply    Vdd      0       5
vclk       clk      0       pulse(0 5 20n 4n 4n 36n 80n)
vreset     reset    0       pulse(5 0 140n 4n 4n)          ;>5 bits long
xxx Vdd    reset    resbar          invert
vinput     vin      0       2.2                             ;The unknown voltage
*
.subckt    First    Vdd     clk     reset    resbar   D0    ;Dummy first stage
x1  Vdd    reset    resdel  D0               nor2    ;A RESET edge
x2  Vdd    clk      resbar  resdel           clkbuff; detector
.ends
*
.subckt    Active   Vdd     clk     resbar   SARlow        ;Single S.A.R. Bit
+          Qin      Qout    MCin    MCout
+          anin     anout                                  ;Resistor ladder pts.
x1  Vdd    Qout     Qin     SARlow  d1       aux2to1 ;Input Function Block
x2  Vdd    MCin     d1      Qout    d2       aux2to1
x3  Vdd    clk      d2      Qout             clkbuff ;Clocked Buffer
x4  Vdd    Qout     MCin    resbar  MCout    aux2to1 ;"Carry chain"
*
rs  anin   anout    10k                                    ;R/2R ladder cell
rp  anin   sw       20k
s1  sw     0        Vdd     Qout             trans  ;Switch elements
s2  Vdd    sw       Qout    0                trans
.ends
*
.subckt    Last     Vdd     clk     reset    SEbar         ;Dummy Final Stage
+          Qin      Done    MCn
x1  Vdd    SEbar    Qin     0       d1       aux2to1
x2  Vdd    Done     SEbar   d2               nor2
x3  Vdd    Done     d1      d3               nor2
x4  Vdd    d2       reset   MCn              nor2
x5  Vdd    d3       reset   d4               nor2
x6  Vdd    clk      d4      Done             clkbuff
.ends
```

****************************************************************

```
*
x0    Vdd    clk    reset    resbar  D0      First    ;Start of Register
*
x1    Vdd    clk    resbar   SARlow                   ;5-stage SAR
+            D0     Q0       MC1     MC0    an4 an5  Active
x2    Vdd    clk    resbar   SARlow
+            Q0     Q1       MC2     MC1    an3 an4  Active
x3    Vdd    clk    resbar   SARlow
+            Q1     Q2       MC3     MC2    an2 an3  Active
x4    Vdd    clk    resbar   SARlow
+            Q2     Q3       MC4     MC3    an1 an2  Active
x5    Vdd    clk    resbar   SARlow
+            Q3     Q4       MC5     MC4    an0 an1  Active
*
x6    Vdd    clk    reset    0       Q4     Done MC5 Last
*
rd1   MC0    0      1e9      ;Dummies, so PSPICE sees no floating nodes
rd2   Done   0      1e9
*
*  Rest of the ADC Logic
.model rcomp  vswitch  (ron=1   roff=1e9  voff=-0.01   von=+0.01)
rstart  an0     0       20k              ;Start the R/2R ladder
xcomp   Vdd     compin  SARlow  load     ;The Voltage Comparator
scomp   compin  0       an5     vin      rcomp
sres    compin  0       reset   0        trans   ;Pulldown at Reset
*
.tran 4n 900n UIC
.probe
.end
```

I claim:

1. A successive-approximation register, comprising a single shift register for successively processing, that is presetting and selectively resetting, a number of bits, wherein said single shift register is arranged to provide bit selection for processing the bits and also to provide desired result accumulation of the processed bits, and further, wherein:
  processing of a given bit is arranged to start simultaneously with the completion of processing its immediate preceding bit;
  the bit being processed is recognized by having no set bit in the shift direction and is itself a set bit; and
  the status recognition of bits is performed by a Manchester Carry chain, said chain being arranged to pass information in the opposite direction to the shift direction.

2. A successive-approximation register (SAR), comprising a single shift register for processing, that is presetting and selectively resetting, a number of bits of digital output, wherein said single shift register is arranged to provide bit selection for processing the bits and also to provide desired result accumulation of the processed bits, and wherein the status recognition of bits is performed by a Manchester Carry Chain, said chain being arranged to pass information in the opposite direction to the shift direction and, further, wherein said single shift register comprises an array of stages, said stages including a first stage, a last stage, and a number of active stages equal to the number of bits of digital output.

3. An SAR as claimed in claim 2, wherein the first stage comprises a storage cell and is adapted to provide an output for presetting the active stages.

4. An SAR as claimed in claimed in claim 2, wherein the last stage comprises a storage cell and is adapted to provide an output for controlling the bit selection for processing the active stages.

5. An SAR as claimed in claim 2, wherein each active stage comprises a storage cell for storing successive bits of digital output and switches for selective processing of data for said storage cell.

6. An SAR as claimed in claim 5, wherein each storage cell is implemented in Dynamic Logic and adapted to hold its data as long as clock signals are applied to the register.

7. An SAR as claimed in claim 5, wherein each switch is implemented in CMOS.

8. An SAR as claimed in claim 2, wherein
   (a) the first stage is adapted to provide an output for presetting the active stages,
   (b) the last stage is adapted to provide an output for controlling the bit selection for processing the active stages, and
   (c) each active stage comprises a storage cell for storing successive bits of digital output and switches for selective processing of data for said storage cell.

9. An SAR as claimed in claim 2 comprising only transistors of a single standard size and implemented in gate array devices.

10. A successive-approximation register, comprising:
   a plurality of active stages, each active stage comprising
      storage means, having an input and an output, for storing a bit of binary data on said output; and
      a combinational logic circuit connected to said input of said storage means;
   said storage means being coupled together by said combinational logic circuits to form a series of said active stages configured to permit determination of the bits of binary data in a direction of decreasing significance from a most significant bit to a least significant bit; and
   each of said combinational logic circuits being configured to selectively provide data to the input of its associated storage means in accordance with the output of its associated storage means and the outputs of the storage means containing less significant bits; wherein said combinational logic circuits together comprise a Manchester Carry Chain.

11. A successive-approximation register as defined in claim 10, wherein each of said combinational logic circuits is configured to generate a carryout signal in accordance with the output of its associated storage means and the outputs of the storage means containing less significant bits; and
   wherein the carryout signal generated by each combinational logic circuit comprises a carryin signal used by the combinational logic circuit associated with the storage means containing the next most significant bit, and further,
   wherein each of said combinational logic circuits is configured to be responsive to carryin signal to selectively provide data to the input of its associated storage means.

12. A successive-approximation register as defined in claim 10, wherein each of said combinational logic circuits comprises a first multiplexer having a pair of inputs and an output, said first multiplexer output being selectively switched to one of said pair of inputs in accordance with the output of its associated storage means.

13. A successive-approximation register as defined in claim 12, wherein each of said combinational logic circuits further comprises a second multiplexer having a second pair of inputs and a second output, one of said second pair of inputs being coupled to said first multiplexer output, the other of said second pair of inputs being coupled to the output of its associated storage means, and said second multiplexer output being selectively switched to one of said second pair of inputs in accordance with the outputs of the storage means containing less significant bits.

14. A successive-approximation register as defined in claim 10, further comprising a reset input and a first stage having a reset storage means for storing a bit of binary data, wherein said reset input is coupled by said first stage to the active stage containing the most significant bit.

15. A successive-approximation register as defined in claim 10, further comprising reset means, coupled via said Manchester Carry Chain to each of said inputs of said storage means, for providing predetermined data to said inputs in response to a reset signal.

16. A successive-approximation register as defined in claim 10, further comprising means for serially shifting the bits of binary data out of said active stages.

17. A successive-approximation register comprising:
   a plurality of active stages;
   a date input coupled to each of said active stages;
   a last stage; and
   a reset input;
   each active stage comprising
      storage means, having an input and an output, for storing a bit of binary data on said output; and
      a combinational logic circuit connected to said input of said storage means;
   said storage means being coupled together by said combinational logic circuits to form a series of said active stages configured to permit determination of the bits of binary data in a direction of decreasing significance from a most significant bit to a least significant bit; and
   each of said combinational logic circuits being configured to selectively provide data to the input of its associated storage means in accordance with the output of its associated storage means and the outputs of the storage means containing less significant bits;
   said last stage having an output and an input, wherein said input of said last stage is coupled to the output of the storage means containing the least significant bit and further, wherein the combinational logic circuit associated with the storage means containing the least significant bit is configured to selectively provide data to the input of its associated storage unit in response to said output of said last stage; and
   said reset input being coupled to said last stage and the active stage containing the most significant bit, wherein said combinational logic circuits and said last stage are configured to permit initialization of the most significant bit to a preset value and each of the remaining bits to a reset value when a reset signal is applied to said reset input.

18. A successive-approximation register as defined in claim 17, wherein each of said combinational logic circuits are configured to load into its associated storage means the bit stored in the storage means containing the next most significant bit when the bit stored in its associated storage means and each of the less significant bits are equal to the reset value.

19. A successive-approximation register as defined in claim 17, wherein each of said combinational logic circuits are configured to provide a bit of data from said data input to the input of its associated storage means when the bit stored in its associated storage means is equal to the preset value and each of the less significant bits are equal to the reset value.

20. A successive-approximation register as defined in claim 17, wherein each of said combinational logic circuits are configured to prevent the value of the bit stored in its associated storage means from changing when at least one of the less significant bits is equal to the preset value.

21. A successive-approximation register as defined in claim 17, wherein the preset value is logical One and the reset value is a logical Zero.

22. A successive-approximation register as defined in claim 17, wherein said last stage comprises:
storage means for storing a bit of binary data, said last stage storage means having an input coupled to the input of said last stage and an output coupled to the output of said last stage; and
a logic circuit coupled to said last stage storage means, said logic circuit being responsive to the output of said last stage storage means to selectively enable and prevent loading of the least significant bit into said last stage storage means.

23. An analog to digital converter of the type having a successive-approximation register for storing a digital representation of an analog signal, a digital to analog converter for converting the digital representation to an analog output, and a comparator for comparing the analog output to the analog signal, wherein the improvement comprises:
A successive-approximation register having a plurality of active stages, each active stage including
storage means, having an input and an output, for storing a bit of binary data on said output; and
a combinational logic circuit connected to said input of said storage means;
said storage means being coupled together by said combinational logic circuits to form a series of said active stages configured to permit determination of the bits of binary data in a direction of decreasing significance from a most significant bit to a least significant bit; and
each of said combinational logic circuits being configured to selectively provide data to the input of its associated storage means in accordance with the outputs of its associated storage means containing less significant bits;
wherein said combinational logic circuits together comprise a Manchester Carry Chain.

24. A successive-approximation register of the type wherein successive stages of the register are loaded with a preset bit during each iteration of a successive-approximation routine, comprising:
a data input;
a plurality of stages serially coupled together, each stage comprising
a storage cell having an input and an output; and
combinational logic means for providing data from said data input to the input of the one of said storage cells containing the preset bit;
wherein said combinational logic circuits together comprise a Manchester Carry Chain.

25. A successive-approximation register having a number of bits of digital output, comprising:
a single register array having a number of bit stages corresponding to the number of bits of digital output; and
logic NOR means coupled to each bit stage, said logic NOR means having an output identifying the bit stage currently being processed;
wherein said logic NOR means comprises a Manchester Carry Chain.

26. A successive-approximation register as claimed in claim 25, wherein a next bit stage to set is identified by position of a Least Significant logic "ONE".

27. A successive-approximation register comprising:
a single register array having a number of bit stages corresponding to a number of bits of digital output;
the register being configured to evaluate data in a shift direction from most significant bit to least significant bit; and
logic means adapted to identify which next bit stage to set by location of a least significant bit logic ONE in the register, said logic means including a Manchester Carry Chain.

28. A successive-approximation register as claimed in claim 27, wherein the single array has a first stage, a last stage and a number of active bit stages equal to the number of bits of digital output.

29. A successive-approximation register as claimed in claim 28, wherein:
(a) the first stage is adapted to provide an output for presetting the active stages;
(b) the last stage is adapted to provide an output for determining the completion of processing the active stages; and
(c) each active stage comprises a storage cell for storing successive bits of desired digital output and switches for selective processing of data for said storage cell.

30. A successive-approximation register as claimed in claim 27, wherein processing of a given bit is arranged to start simultaneously with the completion of processing its immediate preceding bit.

31. A successive-approximation register as claimed in claim 27, wherein presetting of a given bit is arranged to occur simultaneously with selective resetting of its immediate preceding bit.

32. A successive-approximation register as claimed in claim 27, wherein the logic means comprises a Manchester Carry chain, said chain being arranged to pass information in the opposite direction to the shift direction.

33. A successive-approximation register as claimed in claim 27, wherein the register is adapted to provide a bit-serial output.

34. A successive-approximation register as claimed in claims 25 or 27, comprising only transistors of a single standard size and implemented in gate array devices.

35. A successive-approximation register as claimed in claim 25 or 27, implemented in VLSI.

36. A successive-approximation register as claimed in claim 25 or 27, implemented in MOS.

37. A successive-approximation register having a number of bits of digital output, comprising:
a plurality of bit stages arranged in a single register array, the number of bit stages corresponding to the number of bits of digital output; and
logic means adapted to track which bit is currently being processed, the logic means including a Manchester Carry chain.

* * * * *

UNITED STATES PATENT AND TRADEMARK OFFICE
CERTIFICATE OF CORRECTION

PATENT NO. : 5,377,248
DATED : December 27, 1994
INVENTOR(S) : David R. Brooks

It is certified that error appears in the above-indentified patent and that said Letters Patent is hereby corrected as shown below:

Column 7, line 58, change "RESET" (second occurrence) to -- RESET\ --.

Column 21, line 60, after "to" (second occurrence) insert -- its --.

Column 23, line 17, after "is" insert -- a --.

Signed and Sealed this

Ninth Day of May, 1995

BRUCE LEHMAN

Attest:

Attesting Officer

Commissioner of Patents and Trademarks